United States Patent [19]
Hee et al.

[11] Patent Number: 6,043,766
[45] Date of Patent: Mar. 28, 2000

[54] DISTRIBUTIVE ENCODER FOR ENCODING ERROR SIGNALS WHICH REPRESENT SIGNAL PEAK ERRORS IN DATA SIGNALS FOR IDENTIFYING ERRONEOUS SIGNAL BASELINE, PEAK AND EQUALIZATION CONDITIONS

[75] Inventors: Wong Hee, San Jose; Abhijit Phanse, Santa Clara, both of Calif.

[73] Assignee: National Semiconductor Corporation, Santa Clara, Calif.

[21] Appl. No.: 09/076,187

[22] Filed: May 12, 1998

Related U.S. Application Data

[60] Provisional application No. 60/069,027, Dec. 10, 1997, provisional application No. 60/069,044, Dec. 10, 1997, provisional application No. 60/069,031, Dec. 10, 1997, provisional application No. 60/069,091, Dec. 10, 1997, provisional application No. 60/069,030, Dec. 10, 1997, provisional application No. 60/069,028, Dec. 10, 1997, provisional application No. 60/069,029, Dec. 10, 1997, and provisional application No. 60/067,764, Dec. 10, 1997.

[51] Int. Cl.[7] .................................................. H03M 1/12
[52] U.S. Cl. ............................................. 341/94; 341/155
[58] Field of Search ..................................... 341/155, 140, 341/94, 132

[56] References Cited

U.S. PATENT DOCUMENTS

| | | | |
|---|---|---|---|
| 5,901,158 | 4/1999 | Weng et al. | 341/94 |
| 5,923,274 | 7/1999 | Fischer | 341/94 |

*Primary Examiner*—Brian Young
*Attorney, Agent, or Firm*—Limbach & Limbach L.L.P.

[57] ABSTRACT

A distributive encoder for receiving and processing digital error signals representing variations in peak values of an equalized incoming digital data signal and in accordance therewith encoding error signals which represent signal peak errors in data signals for purposes of identifying erroneous signal baseline, peak and equalization conditions. The digital error signals represent variations in peak values of an equalized incoming digital data signal which includes a data signal baseline intermediate to its positive and negative peaks. Two sets of the digital error signals identify when present positive and negative levels transcend prior positive and negative levels, respectively, of the equalized incoming digital data signal. Using various subsets of these digital error signals, the distributive encoder generates encoded error signals which identify erroneous signal baseline, peak and equalization conditions. Using various ones of these encoded error signals, a baseline control circuit can generate a baseline control signal for use in controlling a correction of the equalized incoming digital data signal baseline, a peak control circuit can generate a peak control signal for use in controlling compensation for the positive and negative peaks of the equalized incoming digital data signal, and an equalization control circuit can generate a set of equalization control signals for use in controlling the equalization of the incoming digital data signal.

26 Claims, 4 Drawing Sheets

Microfiche Appendix Included
(3 Microfiche, 293 Pages)

DISTRIBUTIVE ENCODER FOR ENCODING ERROR SIGNALS WHICH REPRESENT SIGNAL PEAK ERRORS IN DATA SIGNALS FOR IDENTIFYING ERRONEOUS SIGNAL BASELINE, PEAK AND EQUALIZATION CONDITIONS

RELATED APPLICATIONS

This application claims the benefit of and incorporates herein by reference the following U.S. provisional patent applications:

60/069,027, filed Dec. 10, 1997, entitled "Peak Error Detector"

60/069,044, filed Dec. 10, 1997, entitled "Signal Gating Controller For Enhancing Convergency of MLT3 Data Receivers"

60/069,031, filed Dec. 10, 1997, entitled "Digital Interface Circuit"

60/069,091, filed Dec. 10, 1997, entitled "Digital Signal Processing Control Circuit For Controlling Corrections of Input Data Signal Errors"

60/069,030, filed Dec. 10, 1997, entitled "Control Loop For Data Signal Baseline Correction"

60/069,028, filed Dec. 10, 1997, entitled "Control Loop For Adaptive Equalization of a Data Signal"

60/069,029, filed Dec. 10, 1997, entitled "Control Loop For Multilevel Sampling of a Data Signal"

60/067,764, filed Dec. 10, 1997, entitled "Data Signal Baseline Error Detector"

A portion of the disclosure of this patent document contains material which is subject to copyright protection. The copyright owner has no objection to the facsimile reproduction by anyone of the patent document or the patent disclosure, as it appears in the patent and trademark office, patent file or records, but otherwise reserves all copyright rights whatsoever.

This application is submitted with a microfiche appendix containing copyrighted material, copyright 1996, National Semiconductor Corporation. Such appendix consists of 3 microfiche transparencies with a total of 293 frames.

BACKGROUND OF THE INVENTION

1. Field of the Invention

The present invention relates to circuits for detecting and correcting digital data signal errors, and in particular, to distributive encoders for encoding error signals which represent signal peak errors in data signals for purposes of identifying erroneous signal baseline, peak and equalization conditions.

2. Description of the Related Art

Recovery data from data signals which have been transmitted over long lengths of cable at high data rates requires that such data signals be equalized in order to compensate for the signal loss and phase dispersion characteristics of the cable. Further, in those applications where the cable length may vary, such equalization must be capable of adapting according to the length of the cable.

Conventional adaptive equalization is typically accomplished through the use of a feedback control signal having an amplitude which is proportional to the pulse height of the equalized data signal. However, such a technique for controlling the adaptive equalization process is very sensitive to amplitude errors on the incoming data signal.

Accordingly, it would be desirable to have a control circuit which generates suitable error correction control signals capable of controlling the adaptive equalization process, including correction for signal baseline wander, as well as controlling subsequent amplitude splicing of the equalized data signal.

SUMMARY OF THE INVENTION

A distributive encoder in accordance with the present invention encodes error signals which represent signal peak errors occurring in an incoming data signal for purposes of identifying erroneous signal baseline, peak and equalization conditions. Such an encoder provides encoded error signals which can advantageously be used to generate digital control signals for controlling the equalization of the incoming digital data signal, correcting for baseline wander of such data signal and controlling subsequent amplitude slicing of the equalized data signal.

One embodiment of the present invention includes a baseline error signal encoding circuit for receiving and encoding a plurality of digital error signals which represent errors in peak values of an incoming data signal and in accordance therewith providing one or more encoded digital signals which identify an erroneous baseline condition of the incoming data signal. An input processing circuit is configured to receive and process first and second pluralities of input error signals and in accordance therewith provide a plurality of processed error signals. The first and second pluralities of input error signals represent a plurality of errors in peak values of an incoming data signal which includes a data signal baseline intermediate to first and second opposing peaks of the incoming data signal. An output processing circuit is configured to receive and process the plurality of processed error signals and in accordance therewith provide one or more output error signals which identify a difference between present and prior values of the data signal baseline.

Another embodiment of the present invention includes a peak error signal encoding circuit for receiving and encoding a plurality of digital error signals which represent variations in peak values of an incoming digital data signal and in accordance therewith providing a plurality of encoded digital signals which identify an erroneous signal peak condition. A processing circuit is configured to receive and process first and second pluralities of input error signals and in accordance therewith provide one or more output error signals. The first and second pluralities of input error signals represent a plurality of errors in opposing peak values of an incoming data signal, and the one or more output error signals identify a difference between present and prior ones of the opposing peak values.

Still another embodiment of the present invention includes an equalization error signal encoding circuit for receiving and encoding a plurality of digital error signals which represent variations in peak values of an equalized incoming digital data signal and in accordance therewith providing a plurality of encoded digital signals which identify an erroneous signal equalization condition. A first processing circuit is configured to receive and process first and second pluralities of input error signals and in accordance therewith provide a first output error signal. The first and second pluralities of input error signals represent a plurality of errors in opposing peak values of an incoming data signal, and the first output error signal identifies when a present level of the incoming data signal extends beyond one of first and second prior opposing peak levels of the incoming data signal. A second processing circuit is configured to receive and process the second plurality of input error signals and in accordance therewith provide a second output error signal. The second output error signal when asserted identifies when one of the first plurality of input error signals is in a valid state.

These and other features and advantages of the present invention will be understood upon consideration of the following detailed description of the invention and the accompanying drawings.

DETAILED DESCRIPTION OF THE INVENTION

Figure 1:
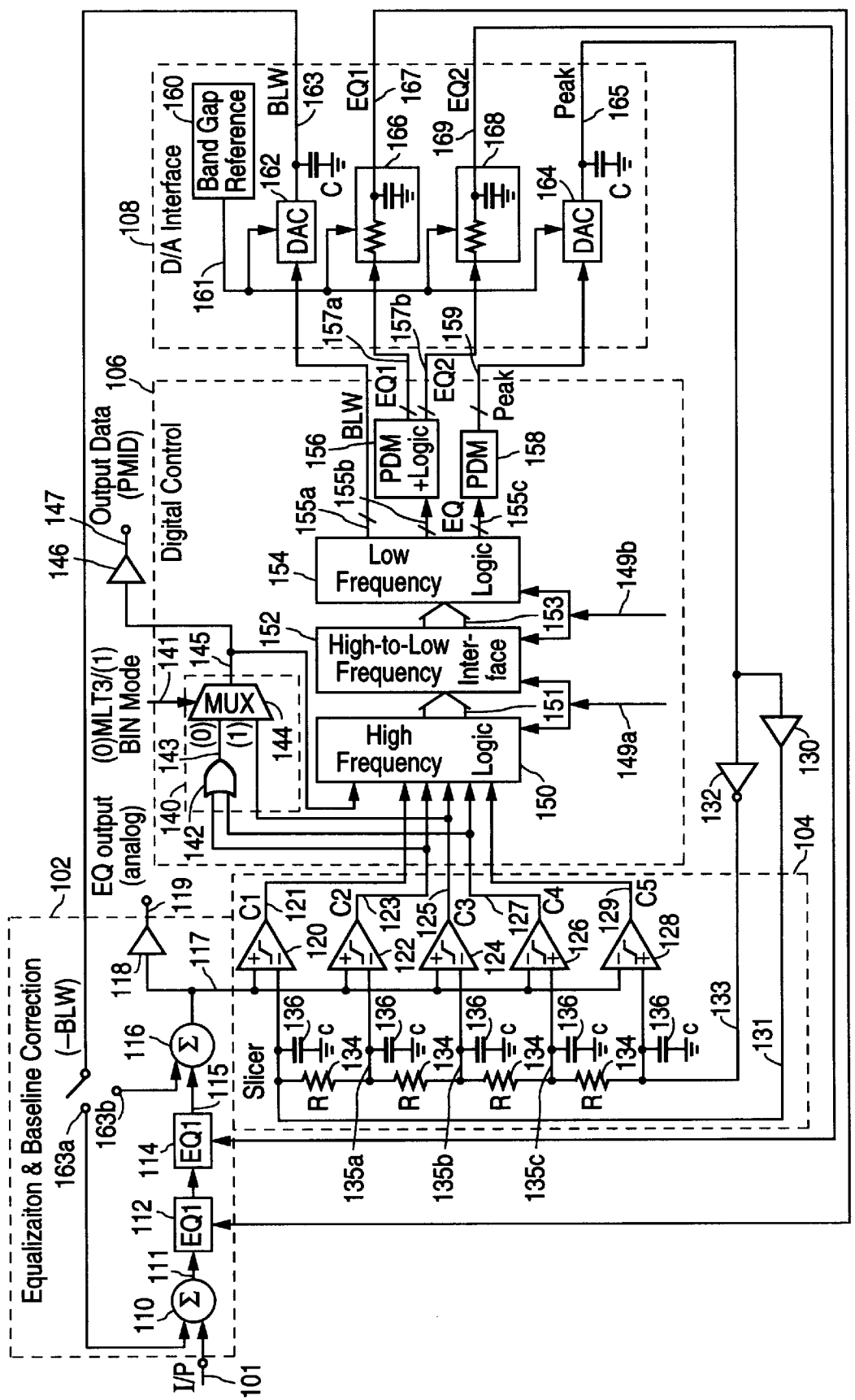
FIG. 1 is a functional block diagram of a high speed data receiver in which a distributive encoder in accordance with the present invention can be advantageously used.

Referring to FIG. 1, a circuit in accordance with the present invention is advantageous for use in a high speed data receiver 100 which receives binary or MLT3 encoded data which has been transmitted via a cable (e.g., fast Ethernet). As discussed in more detail below, such a data receiver 100 provides adaptive equalization and dynamic slicing and baseline restoration of the data signal. (Each of the circuit functions or stages as represented in FIG. 1 and discussed below are described in detail in the code listings provided in the microfiche appendix hereto, the contents of which are incorporated herein by reference. A description of a similar data receiver can be found in co-pending, commonly assigned U.S. patent application Ser. No. 08/791,381, filed Jan. 30, 1997, and entitled "High Speed Data Receiver," the disclosure of which is incorporated herein by reference.)

This data receiver 100 includes a correction stage 102, a slicer stage 104, a digital control stage 106 and a digital-to-analog (D/A) interface 108. As discussed in more detail below, the correction stage 102 provides for equalization and baseline wander correction of the input data signal 101. The slicer stage 104 slices the resulting equalized, corrected data signal 117. The digital control stage 106 processes some of the sliced data signals to produce an output digital data signal 147, as well as generate a number of digital control signals 155a, 157a, 157b, 159 for controlling the equalization, baseline wander correction and slicing of the input data signal 101. The D/A interface 108 converts such digital control signals 155a, 157a, 157b, 159 into corresponding analog signals 163, 165, 167, 169 for actually providing such control of the equalization, baseline wander correction and slicing of the input data signal 101.

The incoming data signal 101, which has been received via a long cable of variable length (not shown), is selectively combined with a baseline correction signal 163 (discussed further below) in a signal summer 110. The corrected signal 111 is selectively amplified by a series of adaptive equalizers, 112, 114, which each have a signal gain which increases with frequency in accordance with their respective equalizer control signals 167, 169. The resulting equalized signal 115 is selectively combined with an alternative baseline correction signal 163 in another signal summer 116. (For testing purposes, the final equalized, corrected data signal 117 is buffered by an analog buffer amplifier 118 to be provided as an analog, equalized, corrected output data signal 119, and is also provided to the signal slicer 104.)

A description of a signal equalization technique using a series of signal equalizers in this manner can be found in co-pending, commonly assigned U.S. patent application Ser. No. 08/791,382, filed Jan. 30, 1997, and entitled "Multiple Stage Adaptive Equalizer," the disclosure of which is incorporated herein by reference.

The slicer 104 receives and slices the equalized, corrected data signal 117 in accordance with positive 131 and negative 133 data peak reference signals using a set of voltage comparators 120, 122, 124, 126, 128. The positive 131 and the negative 133 data peak reference signals are the buffered, non-inverted and inverted versions of a data peak signal 165 (discussed further below) as generated by non-inverting 130 and inverting 132 buffer amplifiers, respectively. These data peak reference signals 131, 133 are applied differentially across a resistive voltage divider with four resisters 134, thereby generating five respective reference signals 131, 135a, 135b, 135c, 133, each of which is filtered by a capacitor 136 for use as a reference signal for its respective voltage comparator 120, 122, 124, 126, 128. Based upon these reference signals, 131, 135a, 135b, 135c, 133, each comparator 120, 122, 124, 126, 128 produces a respective binary output signal 121, 123, 125, 127, 129, each of which is asserted at a logic one level when the data signal 117 transcends the value of the corresponding reference input signal 131, 135a, 135b, 135c, 133.

For example, for the positive 120 and negative 128 peak voltage comparators, the positive 131 and negative 133 data peak reference signals serve as their reference signals, respectively. The middle reference signal 135b represents the mean (e.g., zero or baseline) and serves as the reference signal for the middle comparator 124. The remaining positive reference signal 135a represents a voltage between the mean voltage 135b and the positive peak voltage 131 and serves as the reference for the positive level comparator 122. Similarly, the remaining negative reference 135c represents a voltage between the mean voltage 135b and the negative peak voltage 133 and serves as the reference for the negative level comparator 126.

The binary data signals 121, 123, 125, 127, 129 are received and processed by the digital control stage 106 as follows. The mean 125, positive 123 and negative 127 data signals are processed by a decoder 140 to produce a data signal 145 which is buffered by a buffer amplifier 146 to produce the output digital data signal 147. The positive 123 and negative 127 data signals are logically summed in an OR Gate 142. Then, either the resulting logical sum signal 143 or mean data signal 125 is selected with a multiplexor 144 in accordance with a control signal 141, depending upon whether the original input data signal 101 is an MLT3 or binary signal. This data signal 145 and the binary data signals 121, 123, 125, 127, 129 are received and processed by a high frequency logic stage 150 in accordance with a high frequency clock signal 149a.

The high frequency logic stage 150 processes its input signals 145, 121, 123, 125, 127, 129 in a number of ways to produce a set 151 of digital signals which are then converted to a corresponding set 153 of digital signals at a lower frequency by the high-to-low frequency stage 152 in accordance with the high frequency clock signal 149a and a low frequency clock signal 149b. (By way of example, for fast Ethernet, the high frequency clock signal 149a has a frequency in the hundreds of megahertz and the low frequency clock signal 149b has a frequency in the tens of megahertz.) One operation performed by the high frequency logic stage 150 is that of peak error detection, whereby multiple peak error signals representing variations in the signal peaks within selected frequency bands of the incoming data signal are generated and validated so as to identify the occurrence of errors between the peak of the present incoming data signal and estimated peak values of prior incoming data signals within different time windows. A description of this peak error detector can be found in co-pending, commonly assigned U.S. patent application Ser. No. 09/076,186, filed May 12, 1998, 1998, and entitled "Peak Error Detector" (attorney docket no. NSC1-A9010), the disclosure of which is incorporated herein by reference. Another operation performed is that of baseline error detection, whereby a baseline error signal which is generated during an intermediate level state of the multiple level data signal 117 (such as the zero-state of an MLT3 signal) is validated, thereby identifying the occurrence of an error between the baseline of the incoming data signal and an estimated baseline level. A description of this baseline error detector can be found in co-pending, commonly assigned U.S. patent application Ser. No. 09/076,261, filed May 12, 1998, and entitled "Data Signal Baseline Error Detector" (attorney docket no. NSC1-C1010), the disclosure of which is incorporated herein by reference. Yet another operation performed is that of generating gating control signals for gating out false signal pulses caused by improper equalization of the original incoming data signal 101. A description of this gating control circuit can be found in co-pending, commonly assigned U.S. patent application Ser. No. 09/076,425, filed May 12, 1998, and entitled "Signal Gating Controller for Enhancing Convergency of MLT3 Data Receivers" (attorney docket no. NSC1-C0310), the disclosure of which is incorporated herein by reference.

The low frequency logic stage 154, in accordance with the low frequency clock signal 149b, processes these lower frequency signals 153 to produce a number of digital control signals 155a, 155b, 155c. More specifically, as discussed in more detail below, the low frequency logic stage 154 processes the lower frequency error signals 153 to produce control signals for compensating for variations in peak signal values and correcting errors in the baseline of the incoming data signal 111/115, as well as controlling the equalization of the incoming data signal 111.

The high-to-low frequency interface 152, in accordance with the high 149a and low 149b frequency clock signals, converts the incoming error signals 151 to a corresponding set 153 of lower frequency error signals. A more detailed description of this interface 152 can be found in co-pending, commonly assigned U.S. patent application Ser. No. 09/076, 263, filed May 12, 1998, and entitled "Digital Interface Circuit" (attorney docket no. NSC1-C0510), the disclosure of which is incorporated herein by reference.

One set 155a of control signals produced by the low frequency logic stage 154 is used for correcting baseline wander of the original input data signal 101. This set 155a of digital signals is converted to an analog baseline wander control signal 163 by way of a digital-to-analog converter 162. This analog control signal 163 is then summed with either the original input data signal 101 or the equalized input data signal 115, as discussed above.

Another set 155b of control signals is used to generate the equalization control signals 167, 169 for the adaptive equalizers 112, 114 (discussed above). This set 155b of signals is processed using a circuit 156 which includes a pulse density modulator and some associated logic circuitry to produce, in turn, two pulse density modulated control signals 157a, 157b for controlling the two adaptive input signal equalizers 112, 114. Each of these signals 157a, 157b is converted to its respective analog control signal 167, 169 with a resistive-capacitive digital-to-analog conversion circuit 166, 168. A more detailed description of this signal converter can be found in co-pending, commonly assigned U.S. patent application Ser. No. 08/791,367 filed Jan. 30, 1997, and entitled "Distributive Digital-to-Analog Converter," the disclosure of which is incorporated herein by reference.

Yet another set of control signals 155c is used to generate an analog peak signal 165 which is used to generate the differential peak reference signals 131, 133 for the slicer 104, as discussed above. These digital signals 155c are converted with a pulse density modulator 158 to produce a set 159 of pulse density modulated signals which, in turn, are then converted to the analog peak signal 165 by a digital-to-analog converter 164.

Figure 2A:
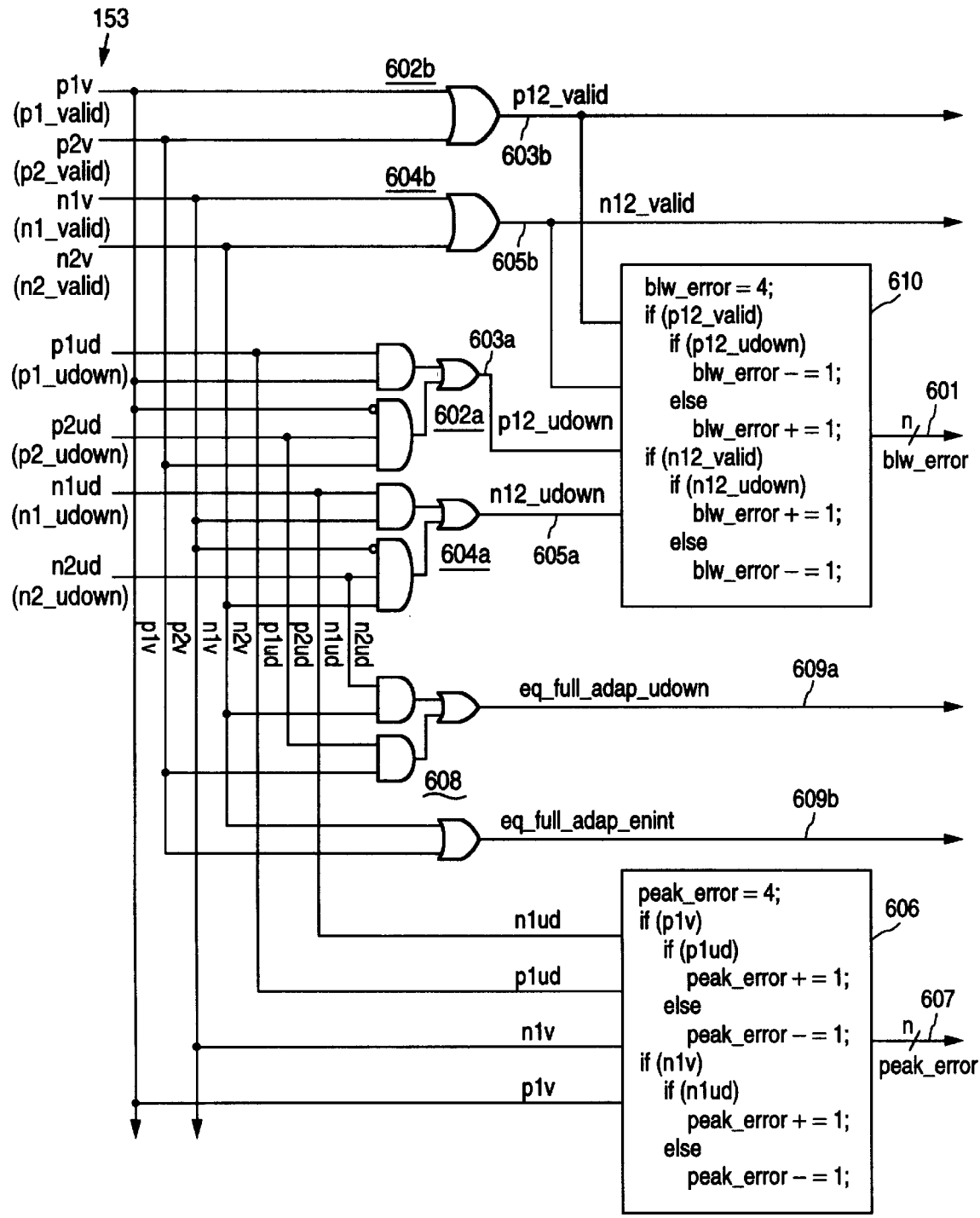
FIGS. 2A and 2B together are a logic diagram of a distributive encoder in accordance with one embodiment of the present invention.
Figure 2B:
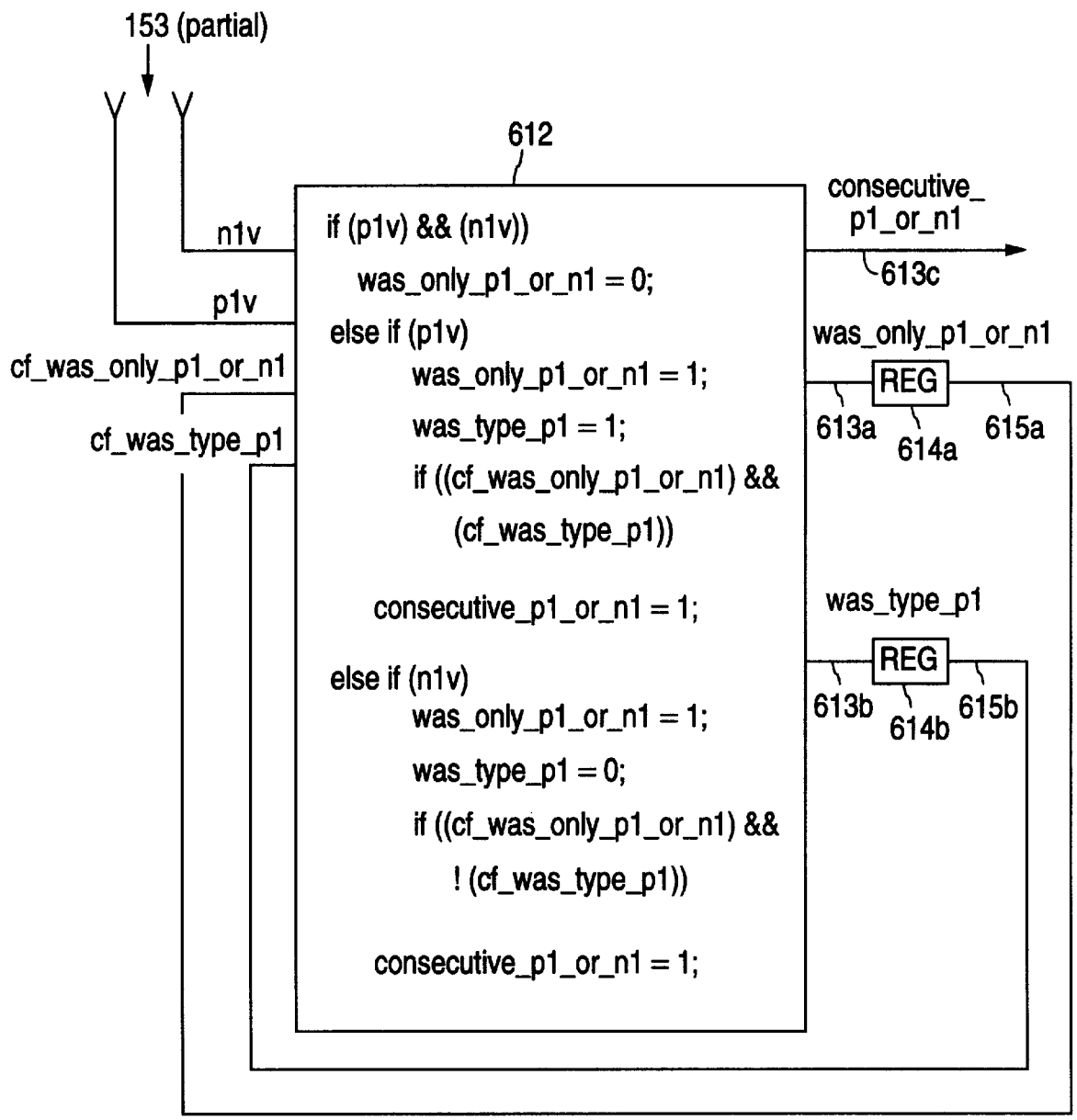

Referring to FIGS. 2A and 2B, a distributive encoder 154a in accordance with one embodiment of the present invention for the low frequency logic stage 154 (FIG. 1) includes a number of logic processing circuits, 602a, 602b, 604a, 604b, 606, 608, 610, 612. As discussed in more detail below, these circuits 602a, 602b, 604a, 604b, 606, 608, 610, 612 receive and process the lower frequency interface signals 153 from the high-to-low frequency interface 152 and, in accordance therewith, produce a number of intermediate control signals 601, 603a, 603b, 607, 609a 609b, 613c which are subsequently used to generate the baseline wander control signals 155a, the equalization control signals 155b and peak error control signals 155c. (Descriptions of the processing and generating of these signals can be found in co-pending, commonly assigned U.S. patent applications Ser. Nos.: 09/076,183, filed May 12, 1998, and entitled "Control Loop For Data Signal Baseline Correction" (attorney docket no. NSC1-C0710); 09/076,260, filed May 12, 1998, and entitled "Control Loop For Adaptive Equalization of a Data Signal" (attorney docket no. NSC1-C0810); and 09/076,256, filed May 12, 1998, and entitled "Control Loop For Adaptive Multilevel Detection of a Data Signal" (attorney docket no. NSC1-C0910); the disclosures of which are incorporated herein by reference.)

The input signals 153 (as discussed in more detail in the aforementioned patent application entitled "Peak Error Detector") identify a number of errors within the equalized, corrected data signal 117 (FIG. 1). For example, the p1ud and p2ud signals are asserted when the equalized, corrected data signal 117 is more positive than the positive data peak reference signal 131. Similarly, the n1ud and n2ud signals are asserted when the equalized, corrected data signal 117 is more negative than the negative data peak reference signal 133. The p1v and p2v signals are asserted subsequent to defined time windows during which the p1ud and p2ud signals, respectively, may be asserted. Similarly, the n1v and n2v signals are asserted following defined time windows during which signals n1ud and n2ud, respectively, may be asserted. (A more detailed description of the criteria for the assertion and de-assertion of these signals can be found in the aforementioned patent application entitled "Peak Error Detector.")

Referring to logic circuits 602a and 602b, the p1ud, p2ud, p1v and p2v signals are logically processed and summed to create a signal 603a (p1ud*p1v+/p1v*p2ud*p2v) which indicates that the equalized, corrected data signal 117 is more positive than the positive data peak reference signal 131, and another signal 603b (p1v+p2v) which is asserted when signal 603a is valid.

Similarly, in logic circuits 604a and 604b, the n1ud, n2ud, n1v and n2v signals are logically processed to create a signal 605a (n1ud*n1v+/n1v*n2ud*n2v) which is asserted when the equalized, corrected data signal 117 is more negative than the negative peak reference signal 133, and another signal 605b (n1v+n2v) which is asserted when signal 605a is valid.

Logic circuit 610 processes signals 603a, 603b, 605a, 605b (in accordance with the logic as identified in FIG. 2A) to produce a multiple bit baseline error signal 601 which represents the magnitude and sign (e.g., polarity) of the difference between present and prior data signal baselines and is active during valid signal activity, i.e., during positive "P" and negative "N" data signal excursions. (A more detailed description of this signal and its use can be found in the aforementioned patent application entitled "Control Loop For Data Signal Baseline Correction.")

Logic circuit 606 processes the n1ud, p1ud, n1v and p1v signals (in accordance with the logic as identified in FIG. 2A) to produce a multiple bit peak error signal 607 which is subsequently used for generating the peak error control signals 155c.

Logic circuit 608 processes the p2ud, n2ud, p2v and n2v signals to create one equalization error signal 609a which indicates whether the equalized data signal 117 (FIG. 1) has transcended one of the predetermined maximum 131 or minimum 133 signal levels, and another equalization error signal 609b which indicates when the first signal 609a is in a valid state. These signals 609a, 609b are used for generating the control signals 155b which, in turn, are used for generating the equalization control signals 167, 169 (FIG. 1). The first of these signals 609a (n2ud*n2v+p2ud*p2v) is directional in nature, i.e., it is asserted when the equalized corrected data signal 117 is either more positive or more negative than the positive 131 or negative 133 data peak reference signal, respectively. The second signal 609b (n1v+ p2v) is asserted when the first signal 609a is valid, i.e., when either the p2v or n2v signal is asserted.

Logic circuit 612 processes the n1v and p1v signals (in accordance with the logic as identified in FIG. 2B) to produce a baseline information signal 613c which indicates when the equalized corrected data signal 117 fails to transcend the desired data signal baseline for a predetermined period of time, e.g., when the baseline of the equalized corrected data signal 117 has shifted in a dramatically more positive or negative manner than desired. (Two additional signals 613a, 613b are generated and buffered by registers 614a, 614b to generate two time-delayed feedback signals 615a, 615b.

Figure 3:
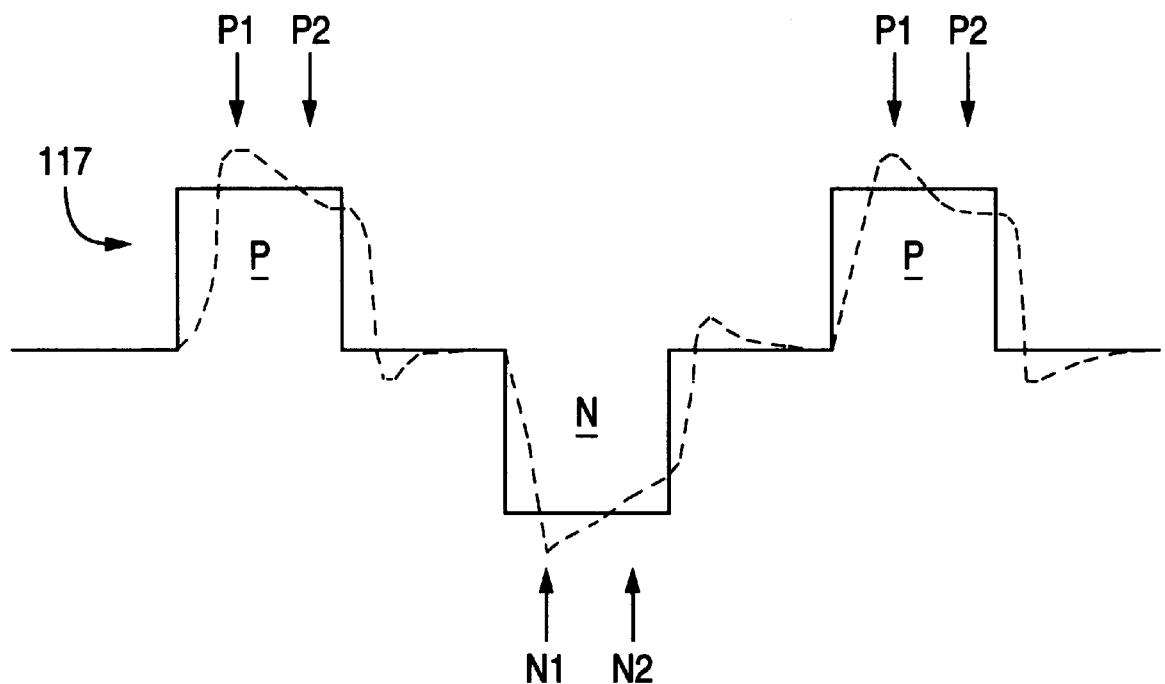
FIG. 3 illustrates an overlay of signal waveforms for ideal and improperly equalized MLT3 signals.
Figure 4:
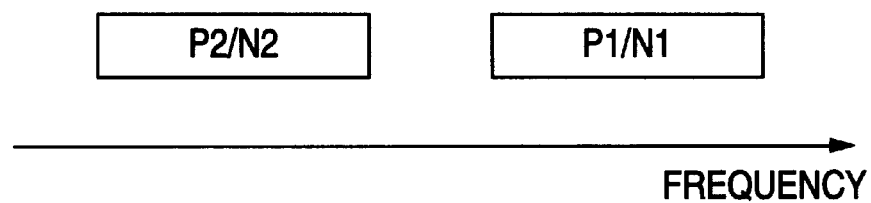
FIG. 4 illustrates qualitatively the different frequency ranges of signal information represented by the input error signals processed by a distributive encoder in accordance with the present invention.

Referring to FIG. 3, the input error signals 153 represent information concerning at least four distinct portions of the data signal 117: "P1" signals contain information about an early portion of the positive signal peak period P; "P2" signals contain information about later portions of the positive signal peak period P (multiple "P2" portions, subsequent to the "P1" portion, may be used for long positive signal peak periods); "N1" signals contain information about an early portion of the negative signal peak period N; and "N2" signals contain information about later portions of the negative signal peak period N (multiple "N2" portions, subsequent to the "N1" portion, may be used for long negative signal peak periods). Therefore, the P1 and N1 signals represent a higher frequency range of data signal 117 components than the P2 and N2 signals, respectively. This is represented qualitatively in FIG. 4.

As discussed above and as represented in FIG. 2A, the baseline error signal 601 is generated using P1, P2, N1 and N2 signal information and is an n-bit signal with a mean value of $2^n/2=2^{(n-1)}$. If, as compared to a prior baseline value, the baseline of the data signal 117 has risen or fallen then the value of this signal 601 is greater than or less than such mean value, respectively.

The peak error signal 607 is generated using P1 and N1 signal information and is also an n-bit signal with a mean value of $2^{(n-1)}$. If, as compared to a corresponding prior peak value, one of the peaks of the data signal 117 has risen or fallen then the value of this signal 601 is greater than or less than such mean value, respectively. In contrast thereto, the equalization error signals 609a, 609b are generated using P2 and N2 signal information. The first equalization error signal 609a indicates the state of equalization of the equalized, corrected data signal 117 (i.e., over or under equalized), while the second equalization error signal 609b indicates when the first signal 609a is in a valid state. By using such different signal information to generate the peak error signal 607 and the equalization error signals 609a, 609b (i.e., P1 and N1 signal information versus P2 and N2 signal information, respectively), such error signals 607 609a, 609b, if processed together, can be used to generate a control signal for controlling the equalization of the data signal 117. This is due to the fact that by using error signals based upon both portions P1, P2 of the positive signal peak period P (or both portions N1, N2 of the negative signal peak period N), an inherent comparison of P1 and P2 signal information (or N1 and N2 signal information) occurs, thereby providing the information useful for controlling equalization of the data signal 117.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a baseline error signal encoding circuit for receiving and encoding a plurality of digital error signals which represent errors in peak values of an incoming data signal and in accordance therewith providing one or more encoded digital signals which identify an erroneous baseline condition of said incoming data signal, said encoding circuit comprising:

an input processing circuit configured to receive and process first and second pluralities of input error signals and in accordance therewith provide a plurality of processed error signals, wherein said first and second pluralities of input error signals represent a plurality of errors in peak values of an incoming data signal which includes a data signal baseline intermediate to first and second opposing peaks of said incoming data signal; and an output processing circuit configured to receive and process said plurality of processed error signals and in accordance therewith provide one or more output error signals which identify a difference between present and prior values of said data signal baseline.

2. The apparatus of claim 1, wherein said first and second pluralities of input error signals identify:
   when a present level of said incoming data signal extends beyond a first prior level of said incoming data signal in a first direction beyond said data signal baseline; and
   when said present level of said incoming data signal extends beyond a second prior level of said incoming data signal in a second direction beyond said data signal baseline, wherein said second direction is opposite said first direction.

3. The apparatus of claim 2, wherein said first plurality of input error signals comprises:
   a first error signal which is asserted when said present incoming data signal level extends beyond said first prior incoming data signal level; and
   a second error signal which is asserted when said present incoming data signal level extends beyond said second prior incoming data signal level.

4. The apparatus of claim 3, wherein said second plurality of input error signals comprises:
   a third error signal which when asserted identifies a valid state of said first error signal; and
   a fourth error signal which when asserted identifies a valid state of said second error signal.

5. The apparatus of claim 1, wherein said one or more output error signals together represent an N-bit binary number which corresponds to said difference between present and prior values of said data signal baseline.

6. The apparatus of claim 5, wherein said N-bit binary number is selectively incremented and decremented in accordance with said difference between present and prior values of said data signal baseline.

7. The apparatus of claim 1, wherein: said first plurality of input error signals identifies
   when a present level of a first portion of said incoming data signal extends beyond a first prior level of said incoming data signal in a first direction beyond said data signal baseline,
   when a present level of a second portion of said incoming data signal extends beyond said first prior incoming data signal level in said first direction,
   when a present level of a third portion of said incoming data signal extends beyond a second prior level of said incoming data signal in a second direction beyond said data signal baseline, wherein said second direction is opposite said first direction, and
   when a present level of a fourth portion of said incoming data signal extends beyond said second prior incoming data signal level in said second direction;
   each one of said second plurality of input error signals identifies a valid state of a respective one of said first plurality of input error signals; and
   said plurality of processed error signals comprises
      a first processed error signal which identifies when said present level of one of said first and second portions of said incoming data signal extends beyond said first prior level of said incoming data signal,
      a second processed error signal which identifies a valid state of said first processed error signal,
      a third processed error signal which identifies when said present level of one of said third and fourth portions of said incoming data signal extends beyond said second prior level of said incoming data signal, and
      a fourth processed error signal which identifies a valid state of said third processed error signal.

8. The apparatus of claim 7, wherein said one or more output error signals together represent an N-bit binary number which is selectively incremented and decremented in accordance with:
   said first processed error signal when said second processed error signal identifies a valid state of said first processed error signal; and
   said third processed error signal when said fourth processed error signal identifies a valid state of said third processed error signal.

9. An apparatus including a peak error signal encoding circuit for receiving and encoding a plurality of digital error signals which represent variations in peak values of an incoming digital data signal and in accordance therewith providing a plurality of encoded digital signals which identify an erroneous signal peak condition, said encoding circuit comprising:
   a processing circuit configured to receive and process first and second pluralities of input error signals and in accordance therewith provide one or more output error signals, wherein said first and second pluralities of input error signals represent a plurality of errors in opposing peak values of an incoming data signal, and wherein said one or more output error signals identify a difference between present and prior ones of said opposing peak values.

10. The apparatus of claim 9, wherein said first and second pluralities of input error signals identify:
    when a present level of said incoming data signal extends in a first direction beyond a first prior peak level of said incoming data signal; and
    when said present level of said incoming data signal extends in a second direction beyond a second prior peak level of said incoming data signal, wherein said first and second prior peak levels represent prior opposing peaks of said incoming data signal and said second direction is opposite said first direction.

11. The apparatus of claim 10, wherein said first plurality of input error signals comprises:
    a first error signal which is asserted when said present incoming data signal level extends beyond said first prior peak level; and
    a second error signal which is asserted when said present incoming data signal level extends beyond said second prior peak level.

12. The apparatus of claim 11, wherein said second plurality of input error signals comprises:
    a third error signal which when asserted identifies a valid state of said first error signal; and
    a fourth error signal which when asserted identifies a valid state of said second error signal.

13. The apparatus of claim 9, wherein said one or more output error signals together represent an N-bit binary number which corresponds to said difference between present and prior ones of said opposing peak values.

14. The apparatus of claim 13, wherein said N-bit binary number is selectively incremented and decremented in accordance with said difference between present and prior ones of said opposing peak values.

15. The apparatus of claim 14, wherein:
    said first plurality of input error signals comprises
       a first error signal which is asserted when said present incoming data signal level extends beyond said first prior peak level, and
       a second error signal which is asserted when said present incoming data signal level extends beyond said second prior peak level;

said second plurality of input error signals comprises
   a third error signal which when asserted identifies a valid state of said first error signal, and
   a fourth error signal which when asserted identifies a valid state of said second error signal; and
said N-bit binary number is selectively incremented and decremented in accordance with
   said first error signal when said third error signal identifies a valid state of said first error signal, and
   said second error signal when said fourth error signal identifies a valid state of said second error signal.

16. An apparatus including an equalization error signal encoding circuit for receiving and encoding a plurality of digital error signals which represent variations in peak values of an equalized incoming digital data signal and in accordance therewith providing a plurality of encoded digital signals which identify an erroneous signal equalization condition, said encoding circuit comprising:
   a first processing circuit configured to receive and process first and second pluralities of input error signals and in accordance therewith provide a first output error signal, wherein said first and second pluralities of input error signals represent a plurality of errors in opposing peak values of an incoming data signal, and wherein said first output error signal identifies when a present level of said incoming data signal extends beyond one of first and second prior opposing peak levels of said incoming data signal; and
   a second processing circuit configured to receive and process said second plurality of input error signals and in accordance therewith provide a second output error signal, wherein said second output error signal when asserted identifies when one of said first plurality of input error signals is in a valid state.

17. The apparatus of claim 16, wherein said first and second pluralities of input error signals identify:
   when said present level of said incoming data signal extends in a first direction beyond said first prior peak level of said incoming data signal; and
   when said present level of said incoming data signal extends in a second direction beyond said second prior peak level of said incoming data signal, wherein said first and second prior peak levels represent prior opposing peaks of said incoming data signal and said second direction is opposite said first direction.

18. The apparatus of claim 17, wherein said first plurality of input error signals comprises:
   a first error signal which is asserted when said present incoming data signal level extends beyond said first prior peak level; and
   a second error signal which is asserted when said present incoming data signal level extends beyond said second prior peak level.

19. The apparatus of claim 18, wherein said second plurality of input error signals comprises:
   a third error signal which when asserted identifies a valid state of said first error signal; and
   a fourth error signal which when asserted identifies a valid state of said second error signal.

20. The apparatus of claim 19, wherein:
   said first output error signal is asserted when said first and third error signals are both asserted, and when said second and fourth error signals are both asserted; and
   said second output error signal is asserted when at least one of said third and fourth error signals is asserted.

21. An apparatus including an error signal encoding circuit for receiving and encoding a plurality of digital error signals which represent errors in peak values of an incoming data signal and in accordance therewith providing a plurality of encoded digital signals which identify an erroneous baseline condition, an erroneous signal peak condition and an erroneous signal equalization condition of said incoming data signal, said encoding circuit comprising:
   a first processing circuit configured to receive and process first and second pluralities of input error signals and in accordance therewith provide a plurality of processed error signals, wherein said first and second pluralities of input error signals represent a plurality of errors in opposing peak values of an incoming data signal which includes a data signal baseline intermediate to first and second opposing peaks of said incoming data signal;
   a second processing circuit configured to receive and process said plurality of processed error signals and in accordance therewith provide one or more first output error signals which identify a difference between present and prior values of said data signal baseline;
   a third processing circuit configured to receive and process first and second portions of said first and second pluralities of input error signals, respectively, and in accordance therewith provide one or more second output error signals, wherein said one or more second output error signals identify a difference between present and prior ones of said opposing peak values;
   a fourth processing circuit configured to receive and process third and fourth portions of said first and second pluralities of input error signals, respectively, and in accordance therewith provide a third output error signal, wherein said third output error signal identifies when a present level of said incoming data signal extends beyond one of first and second prior opposing peak levels of said incoming data signal; and
   a fifth processing circuit configured to receive and process said fourth portion of said second plurality of input error signals and in accordance therewith provide a fourth output error signal, wherein said fourth output error signal when asserted identifies when one of said third portion of said first plurality of input error signals is in a valid state.

22. The apparatus of claim 21, wherein said first and second pluralities of input error signals identify:
   when a present level of said incoming data signal extends beyond a first prior level of said incoming data signal in a first direction beyond said data signal baseline; and
   when said present level of said incoming data signal extends beyond a second prior level of said incoming data signal in a second direction beyond said data signal baseline, wherein said second direction is opposite said first direction.

23. The apparatus of claim 21, wherein said one or more first output error signals together represent an N-bit binary number which corresponds to said difference between present and prior values of said data signal baseline.

24. The apparatus of claim 21, wherein said first and second pluralities of input error signals identify:
   when said present level of said incoming data signal extends in a first direction beyond a first prior peak level of said incoming data signal; and
   when said present level of said incoming data signal extends in a second direction beyond a second prior peak level of said incoming data signal, wherein said first and second prior peak levels represent prior opposing peaks of said incoming data signal and said second direction is opposite said first direction.

25. The apparatus of claim 21, wherein said one or more second output error signals together represent an N-bit binary number which corresponds to said difference between present and prior ones of said opposing peak values.

26. The apparatus of claim 21, wherein:
said first plurality of input error signals identifies
when a present level of a first portion of said incoming data signal extends beyond a first prior level of said incoming data signal in a first direction beyond said data signal baseline,
when a present level of a second portion of said incoming data signal extends beyond said first prior incoming data signal level in said first direction,
when a present level of a third portion of said incoming data signal extends beyond a second prior level of said incoming data signal in a second direction beyond said data signal baseline, wherein said second direction is opposite said first direction, and
when a present level of a fourth portion of said incoming data signal extends beyond said second prior incoming data signal level in said second direction;
each one of said second plurality of input error signals identifies a valid state of a respective one of said first plurality of input error signals; and
said plurality of processed error signals comprises
a first processed error signal which identifies when said present level of one of said first and second portions of said incoming data signal extends beyond said first prior level of said incoming data signal,
a second processed error signal which identifies a valid state of said first processed error signal,
a third processed error signal which identifies when said present level of one of said third and fourth portions of said incoming data signal extends beyond said second prior level of said incoming data signal, and
a fourth processed error signal which identifies a valid state of said third processed error signal.

* * * * *